United States Patent
Ishida et al.

(10) Patent No.: US 10,310,347 B2
(45) Date of Patent: Jun. 4, 2019

(54) DISPLAY APPARATUS AND METHOD OF MANUFACTURING DISPLAY APPARATUS

(71) Applicant: Sakai Display Products Corporation, Osaka (JP)

(72) Inventors: Shigeru Ishida, Osaka (JP); Nobutake Nodera, Osaka (JP); Ryouhei Takakura, Osaka (JP); Yoshiaki Matsushima, Osaka (JP); Takao Matsumoto, Osaka (JP); Kazuki Kobayashi, Osaka (JP); Taimi Oketani, Osaka (JP)

(73) Assignee: Sakai Display Products Corporation (JP)

( * ) Notice: Subject to any disclaimer, the term of this patent is extended or adjusted under 35 U.S.C. 154(b) by 0 days.

(21) Appl. No.: 15/917,006

(22) Filed: Mar. 9, 2018

(65) Prior Publication Data
US 2018/0196294 A1 Jul. 12, 2018

Related U.S. Application Data

(63) Continuation-in-part of application No. PCT/JP2015/075759, filed on Sep. 10, 2015.

(51) Int. Cl.
| | |
|---|---|
| *H01L 27/12* | (2006.01) |
| *G02F 1/1368* | (2006.01) |
| *G02F 1/1362* | (2006.01) |
| *H01L 29/49* | (2006.01) |

(Continued)

(52) U.S. Cl.
CPC ........ *G02F 1/1368* (2013.01); *G02F 1/13454* (2013.01); *G02F 1/136227* (2013.01); *G02F 1/136286* (2013.01); *H01L 27/124* (2013.01); *H01L 27/1288* (2013.01); *H01L 29/4908* (2013.01); *H01L 29/78672* (2013.01); *G02F 2201/123* (2013.01); *G02F 2202/103* (2013.01)

(58) Field of Classification Search
CPC ............. H01L 29/78672; H01L 27/124; H01L 27/1288
See application file for complete search history.

(56) References Cited

U.S. PATENT DOCUMENTS

| | | |
|---|---|---|
| 5,942,856 A | 8/1999 | Koyama |
| 2009/0095957 A1 | 4/2009 | Miyake et al. |

(Continued)

FOREIGN PATENT DOCUMENTS

| | | |
|---|---|---|
| JP | H0555570 A | 3/1993 |
| JP | H05226656 A | 9/1993 |

(Continued)

*Primary Examiner* — Errol V Fernandes
(74) *Attorney, Agent, or Firm* — St. Onge Steward Johnston & Reens, LLC

(57) ABSTRACT

There are provided a display apparatus and a method of manufacturing the display apparatus. The display apparatus includes a pixel having a first thin film transistor and a drive circuit having a second thin film transistor and driving the pixel, wherein a first channel region of the first thin film transistor and a second channel region of the second thin film transistor are configured to have different electrical characteristics (for example, electron mobility, thereby enabling the first thin film transistor and the second thin film transistor to function suitably for the each role thereof).

6 Claims, 11 Drawing Sheets

(51) Int. Cl.
    *H01L 29/786*     (2006.01)
    *G02F 1/1345*     (2006.01)

(56) References Cited

U.S. PATENT DOCUMENTS

| | | | |
|---|---|---|---|
| 2009/0152554 A1* | 6/2009 | Cho | H01L 27/1229 257/59 |
| 2009/0174690 A1* | 7/2009 | Song | G09G 3/3233 345/204 |
| 2009/0212288 A1* | 8/2009 | Kim | H01L 27/1229 257/57 |
| 2009/0236600 A1 | 9/2009 | Yamazaki et al. | |
| 2010/0258807 A1 | 10/2010 | Nakagawa | |

FOREIGN PATENT DOCUMENTS

| | | |
|---|---|---|
| JP | H0738110 A | 2/1995 |
| JP | H10197896 A | 7/1998 |
| JP | 2007027202 A | 2/2007 |
| JP | 2009099636 A | 5/2009 |
| JP | 2009163247 A | 7/2009 |
| JP | 2009260277 A | 11/2009 |
| JP | 2010245480 A | 10/2010 |
| JP | 2012114131 A | 6/2012 |
| JP | 2013161963 A | 8/2013 |

* cited by examiner

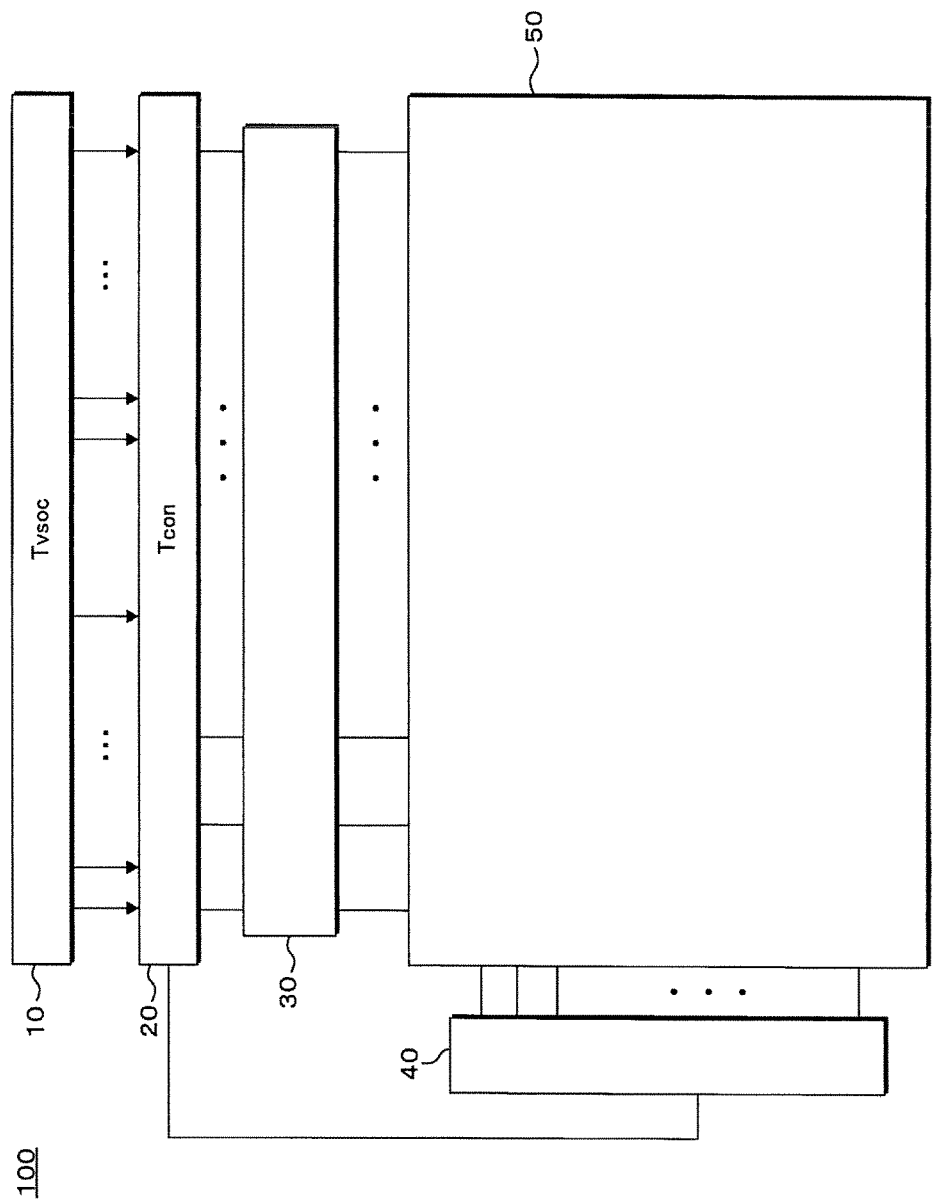

DISPLAY APPARATUS AND METHOD OF MANUFACTURING DISPLAY APPARATUS

CROSS-REFERENCE TO RELATED APPLICATIONS

This is a continuation-in-part of PCT international application No. PCT/JP2015/075759 filed on Sep. 10, 2015, incorporated herein by reference.

FIELD OF THE INVENTION

The present disclosure relates to a display apparatus comprising pixels having a first thin film transistor and a drive circuit having a second thin film transistor and driving the pixels, and a method of manufacturing the display apparatus.

BACKGROUND OF THE INVENTION

In recent years, in a display apparatus having a liquid crystal panel, a thin film transistor (TFT) has been mainly used. Specifically an a-Si TFT using amorphous silicon for a channel region or a P-Si TFT using a polysilicon (poly-crystalline silicon) for a channel region is used. The P-Si TFT is manufactured by laser-annealing method of irradiating a whole surface of a substrate with laser beams and thereafter performing patterning.

JP 2012-114131 A discloses a thin film transistor comprising a gate insulating film formed so as to cover a gate electrode, a polysilicon film formed on the gate insulating film, a source electrode formed above one end of the polysilicon film, and a drain electrode formed, apart from the source electrode, above the other end of the polysilicon film opposed to the one end of the polysilicon film where the source electrode is formed, in which a degree of crystallinity of the polysilicon film gets smaller from the end of the polysilicon film where the source electrode or the drain electrode is formed toward a center portion of the polysilicon film where a source electrode or a drain electrode is not formed.

SUMMARY OF THE INVENTION

In a peripheral circuit or a drive circuit, a high ON-state current is required in order to drive a plurality of picture elements. On the other hand, picture elements are switched on or off frequently, and therefore, a low OFF-state current is desirable.

On the contrary, in the above-mentioned P-Si TFT, both of a current flowing in an ON-state (ON-state current) and a current flowing in an OFF-state (OFF-state current) are high. Therefore, while the P-Si TFT is suitable for a TFT for peripheral circuit or drive circuit, it is not preferable for a TFT for picture elements.

In this way, even in one substrate or in one apparatus, a plurality of TFTs having different electron mobility (electrical characteristic) is needed depending on functions thereof. However, in the case where such a plurality of TFTs is provided using a conventional laser annealing method, complicated steps are needed and much time is required. However, JP 2012-114131 A does not refer to any idea for solving such problem and it does not devise anything in the thin film transistor therein.

The present invention has been made in view of such circumstances as mentioned above, and an object of the present invention is to provide a display apparatus comprising a pixel having a first thin film transistor and a drive circuit having a second thin film transistor and driving the pixel and a method of manufacturing the display apparatus, wherein a first channel region of the first thin film transistor and a second channel region of the second thin film transistor are configured so as to have different electrical characteristic (for example, electron mobility), thereby enabling the first thin film transistor and the second thin film transistor to suitably function for the each role thereof.

A display apparatus according to one embodiment of the present disclosure comprises a pixel having a first thin film transistor, and a drive circuit having a second thin film transistor and driving the pixel, wherein each of the first thin film transistor and the second thin film transistor comprises a gate electrode, a gate insulating film covering the gate electrode, a first amorphous silicon layer formed on the gate insulating film and including a polysilicon region and an amorphous silicon region, a second amorphous silicon layer covering the first amorphous silicon layer, and a source electrode and a drain electrode formed apart from each other above the second amorphous silicon layer the first thin film transistor has a first channel region including a first part of the first amorphous silicon layer, the first part being a part between the source electrode and the drain electrode of the first thin film transistor in a top view; the second thin film transistor has a second channel region including a second part of the first amorphous silicon layer, the second part being a part between the source electrode and the drain electrode of the second thin film transistor in a top view; the first channel region includes the amorphous silicon region and the polysilicon region in the first part; the second channel region includes the polysilicon region in the second part, the second channel region does not include the amorphous silicon region in the second part; and electrical characteristic of the first channel region are different from electrical characteristic of the second channel region.

In the present disclosure, the first channel region includes the amorphous silicon region and the polysilicon region and the second channel region includes only the polysilicon region, thereby configuring the first channel region and the second channel region to be different from each other in electrical characteristic.

In the display apparatus according to another embodiment of the present disclosure, the amorphous silicon region and the polysilicon region exist in the first channel region.

In the present disclosure, in the first thin film transistor, the amorphous silicon region and the polysilicon region may exist in the first channel region.

In the display apparatus according to yet another embodiment of the present disclosure, the polysilicon region included in the first channel region comprises a first region and a second region being separated from each other; the first region overlaps with the source electrode of the first thin film transistor in a laminating direction of the first amorphous silicon layer with the source electrode and the drain electrode; and the second region overlaps with the drain electrode of the first thin film transistor in the laminating direction.

In the present disclosure, the first region of the polysilicon region may overlap with the source electrode of the first thin film transistor in the above-mentioned laminating direction; and the second region of the polysilicon region may overlap with the drain electrode of the first thin film transistor in the laminating direction. In other words, the first and second regions of the polysilicon region may be formed around the source electrode and the drain electrode, respectively.

In the display apparatus according to yet another embodiment of the present disclosure, the polysilicon region included in the first channel region has a longer direction in an array direction of the source electrode and the drain electrode of the first thin film transistor; a first end of the polysilicon region in the longer direction overlaps with an end of the source electrode in a laminating direction of the first amorphous silicon layer with the source electrode and the drain electrode, the end of the source electrode facing the drain electrode; and a second end of the polysilicon region opposed to the first end overlaps with an end of the drain electrode in the laminating direction, the end of the drain electrode facing the source electrode.

In the present disclosure, the both ends of the polysilicon region in the longer direction thereof may overlap, in the laminating direction, with an end part of the source electrode and an end part of the drain electrode facing each other, respectively. A region adjacent to or in the vicinity of the source electrode or the drain electrode may be amorphous silicon region except the both ends of the polysilicon region in the longer direction thereof.

In the display apparatus according to yet another embodiment of the present disclosure, in the first channel region, a dimension of the polysilicon region in a longitudinal direction crossing at a right angle to the longer direction at an intermediate portion between the end of the drain electrode and the end of the source electrode is larger than a dimension of the polysilicon region in the longitudinal direction at a portion between the intermediate portion and the drain electrode or the source electrode.

In the present disclosure, the both ends of the polysilicon region in the longer direction thereof may overlap, in the laminating direction, with the end part of the source electrode and the end part of the drain electrode facing each other, respectively. In the first channel region, the dimension of the polysilicon region in the longitudinal direction crossing at a right angle to the longer direction at the intermediate portion between the end of the drain electrode and the end of the source electrode is larger than the dimension of the polysilicon region in the longitudinal direction at the portion between the intermediate portion and the drain electrode or the source electrode. Therefore, a region adjacent to or in the vicinity of the source electrode or the drain electrode may be amorphous silicon region except the both ends of the polysilicon region in the longer direction thereof.

In the display apparatus according to yet another embodiment of the present disclosure, the polysilicon region included in the first channel region is formed at one place and intervenes between an end of the source electrode facing the drain electrode and an end of the drain electrode facing the source electrode; and the polysilicon region included in the first channel region does not overlap with either of the source electrode or the drain electrode in a laminating direction of the first amorphous silicon layer with the source electrode and the drain electrode.

In the present disclosure, the polysilicon region may intervene between the end of the source electrode facing the drain electrode and the end of the drain electrode facing the source electrode so that the polysilicon region does not overlap with either of the source electrode or the drain electrode in the laminating direction of the first amorphous silicon layer with the source electrode and the drain electrode. A region adjacent to or in the vicinity of the source electrode or the drain electrode may be amorphous silicon region.

In the display apparatus according to yet another embodiment of the present disclosure, crystallinity of polysilicon in the polysilicon region included in the first channel region is different from crystallinity of polysilicon in the polysilicon region included in the second channel region.

In the present disclosure, crystallinity of polysilicon in the polysilicon region included in the first channel region may be different from crystallinity of polysilicon in the polysilicon region included in the second channel region.

In a method of manufacturing a display apparatus according to one embodiment of the present disclosure, the method of manufacturing a display apparatus with a plurality of pixels having a first thin film transistor and a drive circuit having a second thin film transistor and driving the pixels, the method comprises: a step of forming a gate insulating film covering a plurality of gate electrodes, a step of forming an amorphous silicon layer on the gate insulating film, a channel forming step of forming a first channel region constituting a part of the first thin film transistor, and a step of forming a source electrode and a drain electrode, wherein in the channel forming step, a polysilicon region is selectively formed in the amorphous silicon layer so that the first channel region includes the polysilicon region and an amorphous silicon region between the source electrode and the drain electrode in a top view.

In the present disclosure, after forming the gate insulating film covering the plurality of gate electrodes, the amorphous silicon layer is formed on the gate insulating film, and thereafter, the polysilicon region is selectively formed in the amorphous silicon layer to form the first channel region constituting a part of the first thin film transistor. Furthermore, the source electrode and the drain electrode are formed. The polysilicon region is formed so that the first channel region includes the polysilicon region and the amorphous silicon region between the source electrode and the drain electrode in a top view.

In the method of manufacturing a display apparatus according to the present disclosure, the channel forming step may comprise: an annealing step of partly irradiating the amorphous silicon layer with energy beams, thereby turning a part of the amorphous silicon layer to the polysilicon region, a step of forming a second amorphous silicon layer covering the polysilicon region, and a step of forming an n+silicon layer on a surface of the second amorphous silicon layer.

In the present disclosure, in the channel forming step, after turning a part of the amorphous silicon layer to the polysilicon region by partly irradiating the amorphous silicon layer with energy beams, the second amorphous silicon layer covering the polysilicon region may be formed and the n+silicon layer may be formed on the surface of the second amorphous silicon layer.

In the present disclosure, for pixels (picture elements) in which a low OFF-current is needed, the first thin film transistor can surely decrease the OFF-current, and for a drive circuit (a peripheral circuit) in which a high ON-current is needed, the second thin film transistor can surely increase the ON-current. Therefore, the first thin film transistor and the second thin film transistor can suitably function for the respective roles thereof.

BRIEF DESCRIPTION OF THE DRAWINGS

FIG. 1 shows a functional block diagram of major parts of a television receiver according to Embodiment 1.

DETAILED DESCRIPTION OF THE INVENTION

The invention will be further described below in terms of several embodiments for display apparatus and method of manufacturing the display apparatus of the present disclosure and particularly in terms of drawings showing television receivers each comprising a so-called liquid crystal panel.

Embodiment 1

FIG. 1 shows a functional block diagram representing major parts of a television receiver 100 according to Embodiment 1.

The television receiver 100 comprises a TVSoC (System on a chip) 10 (transmitting part), a Tcon (Timing controller) 20, and further, a source driver 30 and a gate driver 40 which receive data from the Tcon 20, and the source driver 30 and the gate driver 40 are connected to a liquid crystal display panel 50 displaying an image based on such data The drive circuit described in claims is, for example, the source driver 30 or the gate driver 40.

The TVSoC 10 is a so-called television receiving circuit, and receives, for example, a CVBS signal, an HDMI (registered trade mark) signal or the like to generate a television image and outputs a television image signal, a horizontal synchronizing signal, a vertical synchronizing signal and an image signal including a clock signal to Tcon 20, for example, by using V-by-One HS Standard.

The Tcon 20 generates, for example, a digital image signal, a control signal for controlling operation of a drive circuit of the liquid crystal display panel 50 and the like. The Tcon 20 transmits the digital image signal and the control signal to the source driver 30 and the gate driver 40. Namely, the Tcon 20 generates a source timing control signal to control an operation timing of the source driver 30 and a gate timing control signal to control an operation timing of the gate driver 40 by using timing signals received from the TVSoC 10, such as a vertical synchronizing signal, a horizontal synchronizing signal, a data enable signal and a clock signal.

The Tcon 20 and the source driver 30 are connected with, for example, 24 buses.

Each pixel (picture element) of the liquid crystal display panel 50 which is not shown is connected to the source driver 30 and the gate driver 40 via a source line and a gate line.

Figure 2A:
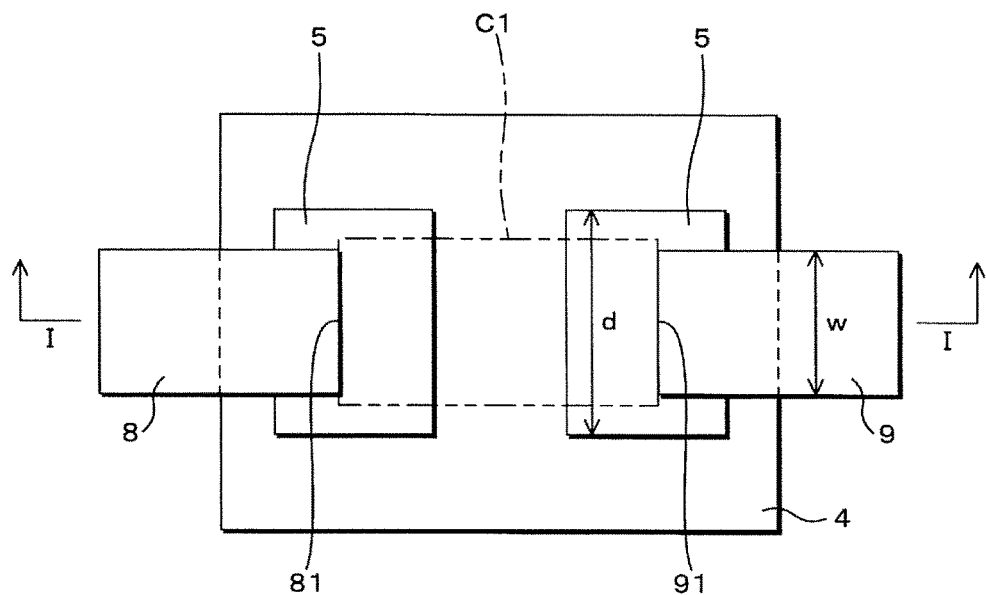
FIG. 2A shows a schematic plan view of one example of a thin film transistor for a pixel of a television receiver according to Embodiment 1.
Figure 2B:
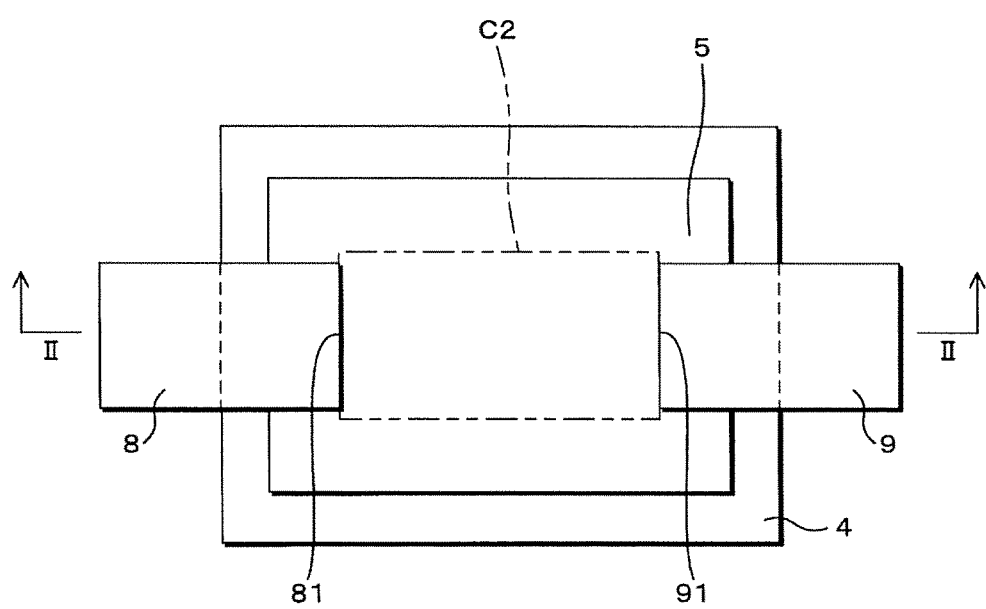
FIG. 2B shows a schematic plan view of one example of a thin film transistor for a drive circuit of a television receiver according to Embodiment 1.

FIG. 2A and FIG. 2B show schematic plan views (top views) of one example of a thin film transistor (also referred to as TFT) for pixel or a drive circuit of a television receiver 100 according to Embodiment 1. FIG. 2A shows a thin film transistor (hereinafter referred to as a thin film transistor for pixel) used for pixel of the television receiver 100, and FIG. 2B shows a thin film transistor (hereinafter referred to as a thin film transistor for drive circuit) used for a drive circuit (peripheral circuit) of the television receiver 100.

Figure 3:
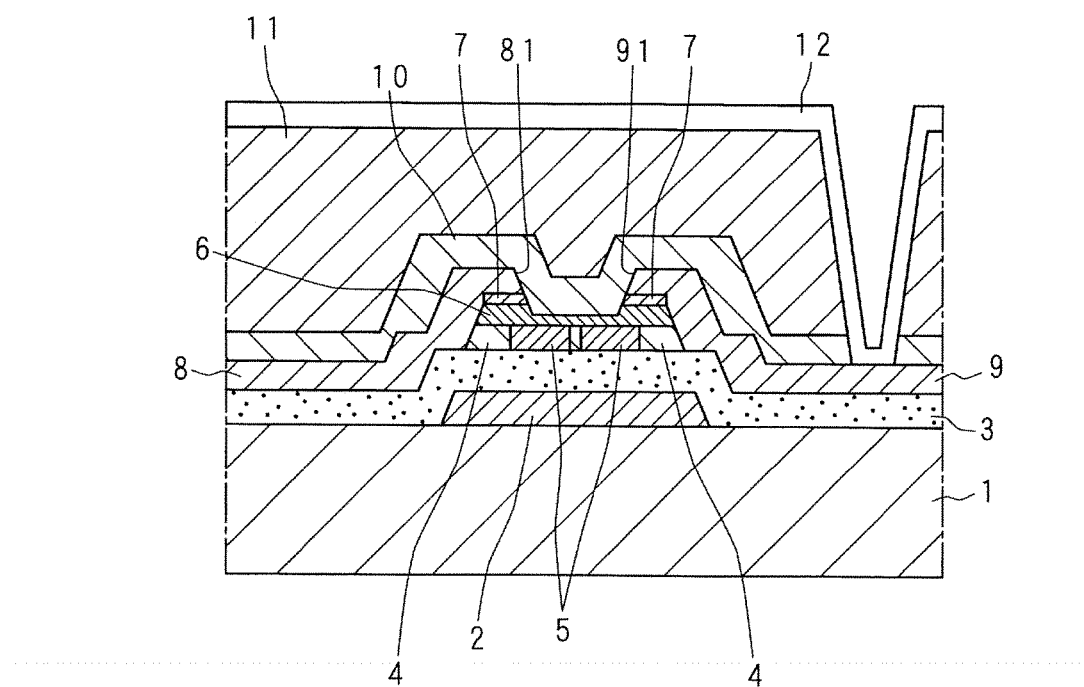
FIG. 3 shows a schematic cross-sectional view along a line I-I of FIG. 2A.
Figure 4:
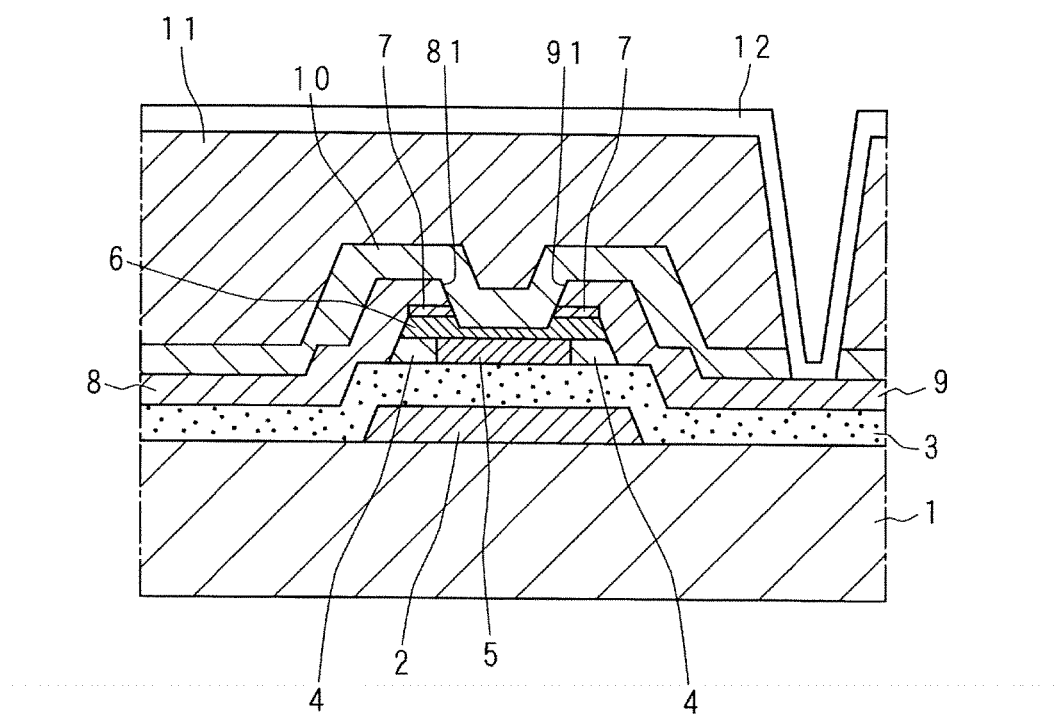
FIG. 4 shows a schematic cross-sectional view along a line II-II of FIG. 2B.

FIG. 3 shows a schematic cross-sectional view along a line I-I of FIG. 2A representing major parts, and FIG. 4 shows a schematic cross-sectional view along a line II-II of FIG. 2B representing major parts.

As shown in FIG. 3 and FIG. 4, each of the thin film transistors comprise a gate electrode 2, a gate insulating film 3 covering the gate electrode 2, a first amorphous silicon layer 4 formed on the gate insulating film 3, a second amorphous silicon layer 6 covering the first amorphous silicon layer 4, and a source electrode 8 and a drain electrode 9 formed apart from each other above the second amorphous silicon layer 6. In more detail, the gate electrode 2 is laminated on the surface of a glass substrate (also called a substrate), and the gate insulating film 3 (for example, $SiO_2$ film, laminated film of $SiO_2$/SiN, SiN film, SiON film and the like) is laminated to cover the gate electrode 2.

Further, as shown in FIG. 2 to FIG. 4, the first amorphous silicon layer 4 (also called an a-Si film) includes a polysilicon region 5 and an amorphous silicon region. The polysilicon region 5 may include not only polycrystal but also microcrystal having a crystal grain size relatively smaller than that of the polycrystal and monocrystal having higher crystallinity. The second amorphous silicon layer 6 (also called an a-Si film) is laminated so as to cover the first amorphous silicon layer 4 (the polysilicon region 5).

An n+silicon layer 7 (n+Si film) is laminated at a given position on the surface of the second amorphous silicon layer 6. The n+silicon layer 7 is a contact layer for the source electrode 8 and the drain electrode 9, and the n+silicon layer 7 is a semiconductor layer having a high concentration of impurity such as phosphorous.

The source electrode 8 and the drain electrode 9 with a desired pattern are formed on the surface of the n+silicon layer 7, the side surfaces of the second amorphous silicon layer 6 and the first amorphous silicon layer 4 and the surface of the gate insulating film 3.

Electric resistances of the amorphous silicon region in the first amorphous silicon layer 4 and the second amorphous silicon layer 6 are large, and OFF-state currents (leakage current) at the amorphous silicon region in the first amorphous silicon layer 4 and the second amorphous silicon layer 6 are small. Further, electron mobility in the polysilicon region 5 is remarkably large as compared with electron mobility in the amorphous silicon region.

The source electrode 8 and the drain electrode 9 are separated with a given space being provided therebetween so that one ends thereof face to each other. A region put between the source electrode 8 and the drain electrode 9 corresponds to a so-called channel region, and carriers (electron or hole) move in the channel region. Namely, such a channel region is a portion corresponding to a space between the source electrode 8 and the drain electrode 9 in the first amorphous silicon layer 4 including the polysilicon region 5 and the second amorphous silicon layer 6. Therefore, the channel region is constituted by the polysilicon region 5, the first amorphous silicon layer 4 and the second amorphous silicon layer 6. Hereinafter the channel region of the thin film transistor for pixel (the first thin film transistor) is referred to as a first channel region C1, and the channel region of the thin film transistor for drive circuit (the second thin film transistor) is referred to as a second channel region C2.

A passivation film 10 is formed from, for example, SiN to cover the source electrode 8 and the drain electrode 9 on the whole TFT, and an organic film 11 is formed on the passivation film 10 to make the surface of the TFT flat. Through-holes are formed at given positions in the passivation film 10 and the organic film 11 to allow conduction between a pixel electrode 12 and the drain electrode via the through-hole. The pixel electrode 12 is formed from a transparent conducting film (for example, ITO).

In FIG. 2A and FIG. 2B, the first amorphous silicon layer 4, the polysilicon region 5, the source electrode 8 and the drain electrode 9 are shown schematically in a state of being projected on the surface of the substrate 1. In FIG. 2A and FIG. 2B, the second amorphous silicon layer 6 and other elements are omitted for the purpose of clear explanation.

In the television receiver 100 according to the embodiment of the present disclosure, electrical characteristic of the first channel region C1 is different from electrical characteristic of the second channel region C2 as described below in detail.

As shown in FIG. 2A, the first thin film transistor (the thin film transistor for pixel) has a first channel region C1 including a part (first part) of the first amorphous silicon layer 4. The first part is a part between the source electrode 8 and the drain electrode 9 of the first thin film transistor in a top view shown in FIG. 2A. In the thin film transistor for pixel, as shown in FIG. 2A, the first channel region C1 includes the amorphous silicon region and the polysilicon region in the first part. Namely, in the thin film transistor for pixel, both of the amorphous silicon region in the first amorphous silicon layer 4 and the polysilicon region 5 exist in the first channel region C1 which is a region between the source electrode 8 and the drain electrode 9.

In the thin film transistor for pixel as shown in FIG. 2A, two polysilicon regions 5 are formed at each place, respectively, and are separated from each other in a separation direction (or an array direction) of the source electrode 8 and the drain electrode 9. Each of the two polysilicon regions 5 is a region having rectangular shape in FIG. 2A. In other words, in FIG. 2A, the polysilicon regions 5 are formed at two separate places in the first amorphous silicon layer 4.

Namely, the polysilicon region included in the first channel region C1 includes a first region and a second region being separated from each other.

Hereinafter, the separation direction (or an array direction) of the two polysilicon regions 5 in FIG. 2A is referred to as a crosswise direction, and the direction crossing at a right angle to the separation direction is referred to as a longitudinal direction.

Out of the two polysilicon regions 5, one polysilicon region 5 (for example, the first region of the polysilicon region) overlaps with an end portion 81 of the source electrode 8 in a laminating direction of the first amorphous silicon layer 4 and the source electrode 8; and the other polysilicon region 5 (for example, the second region of the polysilicon region) overlaps with an end portion 91 of the drain electrode 9 in a laminating direction of the first amorphous silicon layer 4 and the drain electrode 9.

Further, as shown in FIG. 2A, a dimension "d" of the two polysilicon regions 5 in the longitudinal direction is larger than dimensions "W" of the source electrode 8 and the drain electrode 9 in the longitudinal direction. On the other hand, the amorphous silicon region intervenes between the two polysilicon regions 5 in the first amorphous silicon layer 4.

As mentioned above, the two polysilicon regions 5 are separated from each other, and the amorphous silicon region intervenes between the two polysilicon regions 5 in the first amorphous silicon layer 4. Namely, in the first channel region C1, the amorphous silicon region having a large electric resistance intervenes between the polysilicon regions 5, and therefore, an OFF-state current can be suppressed surely as compared with a case where the amorphous silicon region does not intervene between the polysilicon regions 5. On the other hand, a part of each of the polysilicon regions 5 overlaps with the end portion 81, 91 in the source electrode 8 and the drain electrode 9 in the above-mentioned laminating direction, and therefore, decrease of the ON-state current can be prevented.

Further, as shown in FIG. 3, the first thin film transistor includes the first amorphous silicon layer 4 including the polysilicon regions 5 and having a thickness equal to a thickness of the polysilicon regions 5 and the second amorphous silicon layer 6 formed on the surfaces of the polysilicon regions 5 and the first amorphous silicon layer 4.

Namely, the polysilicon regions 5 are regions where one or more parts of the first channel region C1 or a part of the second channel region C2 in the first amorphous silicon layer 4 formed over the gate electrode 2 are turned into a polycrystal state, and exposing, developing and etching treatments are not conducted for forming these channel regions. The second amorphous silicon layer 6 is formed to prevent the source electrode 8 and the drain electrode 9 from contacting directly with the polysilicon regions 5 by using a characteristic of amorphous silicon, namely a small OFF-state current (leakage current). Thus, the OFF-state current can be reduced more.

On the other hand, in the thin film transistor for drive circuit, as shown in FIG. 2B, the second channel region C2 includes only the polysilicon regions but not the amorphous silicon region. Namely, in the thin film transistor for drive circuit, the amorphous silicon region does not exist in the second channel region C2 between the source electrode 8 and the drain electrode 9. In other words, the second thin film transistor (the thin film transistor for drive circuit) has a second channel region C2 including a part (second part) of the first amorphous silicon layer 4. The second part is a part between the source electrode 8 and the drain electrode 9 of the second thin film transistor in a top view shown in FIG.

2B. The second channel region C2 includes the polysilicon region in the second part, but the second channel region C2 does not include the amorphous silicon region in the second part.

In the thin film transistor for drive circuit shown in FIG. 2B, the polysilicon region 5 is formed in the first amorphous silicon layer 4 within a region wider than the second channel region C2 across the space between the end portions 81 of the source electrode 8 and the end portion 91 of the drain electrode 9 facing each other.

As mentioned above, in the second channel region C2, the polysilicon region 5 having an electric resistance smaller than that of the amorphous silicon region is formed across the space between the end portions 81 of the source electrode 8 and the end portion 91 of the drain electrode 9 facing each other. In other words, the second channel region C2 includes only the polysilicon region 5, therefore, as compared with the case where the second channel region C2 includes the amorphous silicon region, the ON-state current can be surely increased.

It can be appreciated that only for the purpose of explanation, each example of the first channel region C1 and the second channel region C2 is shown in FIG. 2A and FIG. 2B, respectively. The first channel region C1 and the second channel region C2 according to the present disclosure are not defined by FIG. 2A and FIG. 2B.

Generally, the channel region can be defined by a channel length which is a distance between the source electrode 8 and the drain electrode 9 and a channel width which is a length of the source electrode 8 and the drain electrode 9 in a direction crossing at a right angle to the channel length.

Figure 5:
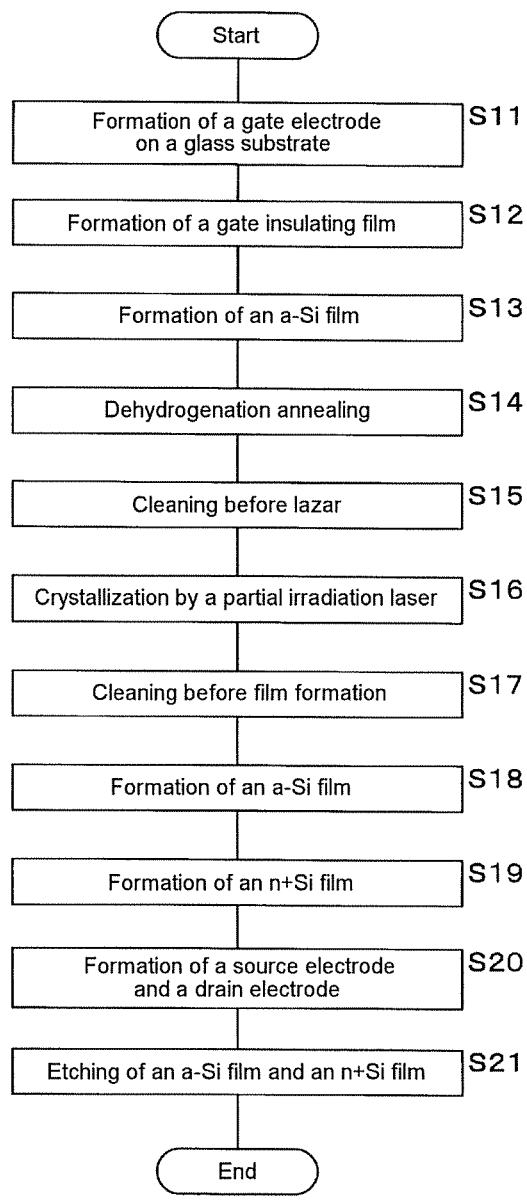
FIG. 5 shows a process flow chart of one example of a manufacturing method of a thin film transistor for pixel of a television receiver according to Embodiment 1.

FIG. 5 shows a flow chart of one example of a manufacturing method of a thin film transistor for pixel of a television receiver 100 according to Embodiment 1. The process for manufacturing a thin film transistor for pixel according to Embodiment 1 is described below. As shown in FIG. 5, the gate electrode 2 is formed on the glass substrate 1 (S11), and the gate insulating film 3 to cover the gate electrode 2 is formed on the surface of the glass substrate 1 (S12).

An a-Si film 4 as the first amorphous silicon layer 4 is formed over the glass substrate 1 having the gate insulating film 3 formed on its surface (S13). Thereafter, a step of forming a channel region (a first channel region C1) constituting a part of the thin film transistor for pixel (a first thin film transistor) is performed, and as mentioned above, the polysilicon region 5 is selectively formed in the first channel region C1.

First, for laser annealing of the a-Si film 4, dehydrogenation annealing treatment (S14) and cleaning before laser (S15) are performed. Subsequently, crystallization of the a-Si film 4 by means of a partial irradiation type laser is performed (S16). The crystallization step is an annealing step (also referred to as a laser annealing step), and for example, energy beams are irradiated on a required portion being a part of the a-Si film 4 via a multi-lens array to turn the required portion to the polysilicon region 5. The required portion is over the gate electrode 2 and is the first channel region C1 between the source electrode 8 and the drain electrode 9. Thus, the two separated polysilicon regions 5 are formed on the first amorphous silicon layer 4 as shown in FIG. 2A. For example, an ultraviolet excimer laser which can be absorbed largely by the first amorphous silicon layer 4 (a-Si film) can be used as the energy beam.

Figure 6:
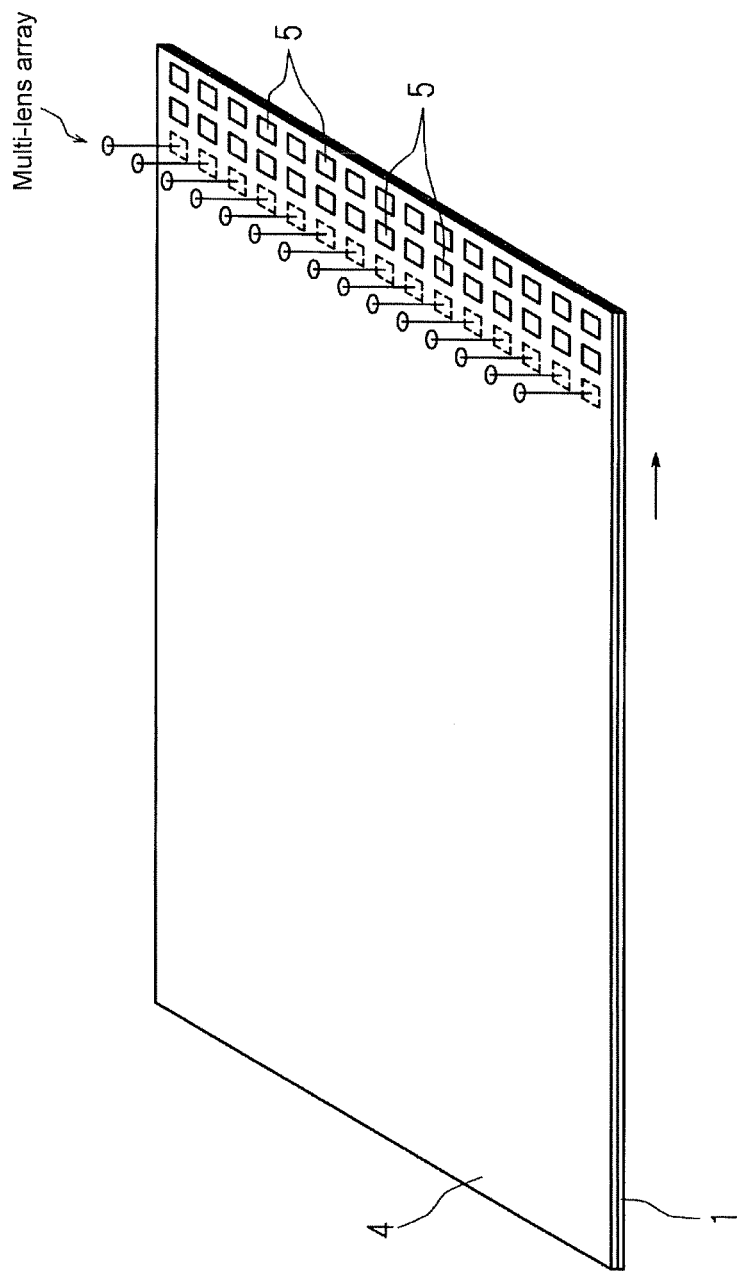
FIG. 6 shows a schematic diagram of one example of a configuration of a partial irradiation type laser according to an embodiment.

FIG. 6 shows a schematic diagram of one example of a configuration of a partial irradiation type laser according to the present embodiment. As shown in FIG. 6, the glass substrate 1 with the a-Si film 4 formed on its surface is placed on a stage (not shown) and is moved at a predetermined speed in a direction shown by an arrow in FIG. 6. The multi-lens array including a plurality of lenses separated from each other at a proper interval is arranged over the glass substrate 1. The plurality of lenses is arranged along a direction crossing to the moving direction of the glass substrate 1. By emitting laser beams from a laser beam source (not shown) onto the multi-lens array, the laser beams are partially irradiated onto a plurality of required portions separated from each other of the a-Si film 4 through different light paths for the respective lenses. Namely, partial laser annealing is performed. Thus, only a required region of the channel region in the a-Si film 4 is selectively turned to the polysilicon region 5.

Next, cleaning before film formation is performed (S17), and an a-Si film 6 is formed as the second amorphous silicon layer 6 to cover the polysilicon region 5 formed into a polycrystal state by the annealing step and the a-Si film 4 as the first amorphous silicon layer 4 (S18). Further, an n+Si film (n+silicon layer) 7 is formed on the a-Si film 6 (S19). The n+Si film 7 is a contact layer for the source electrode 8 and the drain electrode 9 and is a semiconductor layer having a high concentration of impurity such as phosphorous.

Then, the a-Si film 4, the a-Si film 6 and the n+Si film 7 are subjected to etching to be formed into, for example, a rectangular island form.

Subsequently, metal film for the source electrode and drain electrode is provided on the n+Si film 7, and the metal film is etched to form the source electrode 8 and the drain electrode 9 (S20).

Thereafter, in order to form the semiconductor layer into a required structure, etching is performed on the channel region in the n+Si film 7 and the a-Si film 6 using the source electrode 8 and the drain electrode 9 as etching masks in a thickness direction thereof up to the midst of the a-Si film 6 (S21). Thus, the channel region is formed. In a manufacturing of the first thin film transistor, the polysilicon region 5 is formed so that the first channel region includes the polysilicon region 5 and an amorphous silicon region of the a-Si film 4 between the source electrode 8 and the drain electrode 9 in a top view.

In the above embodiment, the case including steps of forming the a-Si film 4, the a-Si film 6 and the n+Si film 7 into an island form is described, but the present disclosure is not limited thereto. In order to decrease the number of masks, these steps can be omitted, and the metal film for the source electrode 8 and the drain electrode 9 can be etched into a predetermined pattern and subsequently the a-Si film 6 and the n+Si film 7 can be etched.

According to the manufacturing method of this embodiment, the first channel region C1 can be formed only by an annealing step including partially irradiating energy beams (for example, laser beams) only on a region, in a-Si film 4, which is to be the polysilicon region 5 without irradiating the energy beams on the whole substrate surface. Therefore, in order to form the first channel region C1, step of forming a crystallized polysilicon region on the whole surface of the substrate as well as each step of exposing, developing and etching for the polysilicon region are not needed, and a manufacturing process can be shortened.

In the above embodiment, an example of selective crystallization for the a-Si film 4 by means of a partial irradiation type laser is described, but the present disclosure is not limited thereto. Such crystallization treatment can be performed on a thin film transistor for drive circuit.

Since the television receiver 100 according to Embodiment 1 has the configuration mentioned above, there is a difference in electrical characteristic between the first channel region C1 and the second channel region C2, and the thin film transistor for pixel can function as a transistor suitable for pixels to display images, and the thin film transistor for drive circuit can function as a transistor suitable for drive circuit for the pixels.

Namely, for the pixels required to decrease an OFF-state current, since the thin film transistor for pixel (first channel region C1) has the configuration as mentioned above, the OFF-state current can be surely suppressed while decrease of an ON-state current can be suppressed. Furthermore, for the drive circuit (peripheral circuit) in which increasing an ON-state current is required, since the thin film transistor for drive circuit (second channel region C2) has the configuration as mentioned above, the ON-state current can be surely increased.

Embodiment 2

The present disclosure is not limited to Embodiment 1. In the television receiver 100 according to Embodiment 2, while the configuration of the thin film transistor for pixel (first channel region C1) differs from that of Embodiment 1, the first channel region C1 and the second channel region C2 are configured so that the electrical characteristics of the first and second channel regions C1, C2 differ from each other in the same manner as in Embodiment 1. The details will be described below.

Figure 7:
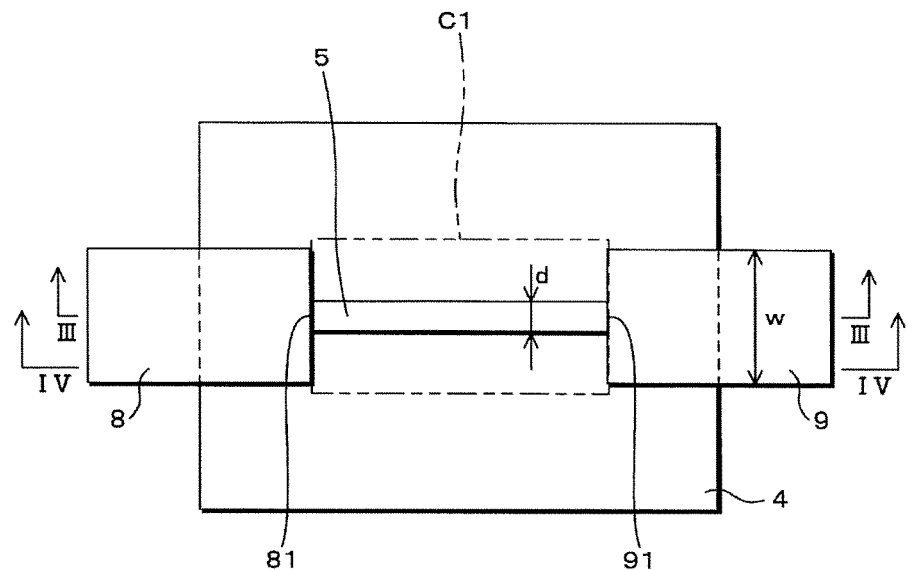
FIG. 7 shows a schematic plan view of one example of a thin film transistor for pixel of a television receiver according to Embodiment 2.
Figure 8:
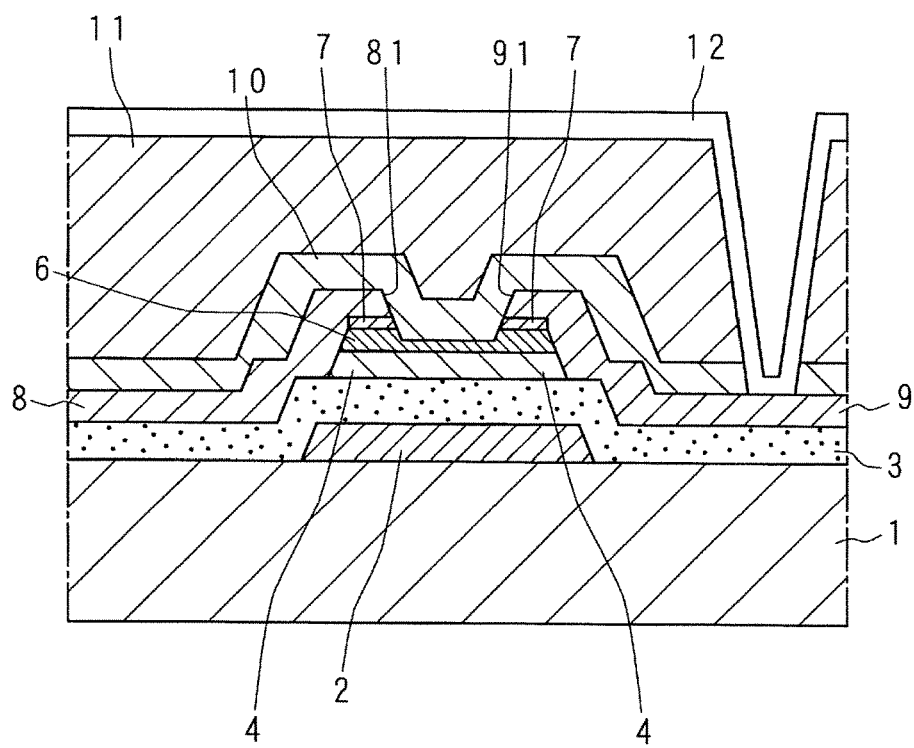
FIG. 8 shows a schematic cross-sectional view along a line IV-IV of FIG. 7.

FIG. 7 shows a schematic plan view (top view) of one example of a thin film transistor for pixel used for pixels of a television receiver 100 according to Embodiment 2, and FIG. 8 shows a schematic cross-sectional view along a line IV-IV of FIG. 7. The schematic cross-sectional view along a line III-Ill of FIG. 7 is the same as FIG. 4 and is omitted. In addition, the thin film transistor for drive circuit according to Embodiment 2 is the same as in Embodiment 1, and the detail explanation thereof is omitted.

In the thin film transistor for pixel according to Embodiment 2, as shown in FIG. 7, the first channel region C1 is configured to include the amorphous silicon region and the polysilicon region. Namely, in the thin film transistor for pixel, both of the amorphous silicon region in the first amorphous silicon layer 4 and the polysilicon region 5 exist in the first channel region C1 which is a region between the source electrode 8 and the drain electrode 9.

As shown in FIG. 7 and FIG. 8, in the thin film transistor for pixel according to Embodiment 2, a long and narrow polysilicon region 5 is formed along the crosswise direction over a range from the end portion 81 of the source electrode 8 to the end portion 91 of the drain electrode 9.

Namely, the polysilicon region 5 included in the first channel region C1 has a longer direction thereof in an array direction (separating direction) of the source electrode 8 and the drain electrode 9 and has a strip-like shape in FIG. 7. Regarding the both ends of the polysilicon region 5 in the longer direction, one end (e.g., first end) overlaps with an end (end portion 81) of the source electrode 8 in a laminating direction of the first amorphous silicon layer 4 with the source electrode 8 and the drain electrode 9. The end (end portion 81) of the source electrode 8 faces the drain electrode 9. Further, another end (e.g., second end opposed to the first end) of the polysilicon region in the longer direction overlaps with an end (end portion 91) of the drain electrode 9 in a laminating direction of the first amorphous silicon layer 4 with the source electrode 8 and the drain electrode 9.

The end (end portion 91) of the drain electrode 9 faces the source electrode 8. In more detail, the both end portions of the polysilicon region 5 overlap with the end portion 81 of the source electrode 8 or the end portion 91 of the drain electrode 9, respectively at an intermediate portion of the source electrode 8 or the drain electrode 9 in the above-mentioned longitudinal direction.

In other words, a dimension "d" of the polysilicon region 5 in the longitudinal direction is smaller than a dimension "W" of the source electrode 8 and the drain electrode 9 in the longitudinal direction, and the both end portions of the polysilicon region 5 overlap partially with the end portion 81 of the source electrode 8 and the end portion 91 of the drain electrode 9, respectively in the laminating direction.

In the television receiver 100 according to Embodiment 2, the thin film transistor for pixel (first channel region C1) has the configuration as mentioned above, and therefore, the thin film transistor for pixel can function suitably as the thin film transistor for pixel required to decrease an OFF-state current.

Namely, by making the dimension "d" of the polysilicon region 5 in the longitudinal direction smaller than the dimension "W" of the source electrode 8 and the drain electrode 9 in the longitudinal direction, a region adjacent to or in the vicinity of the source electrode 8 or the drain electrode 9 in the first channel region C1 can be an amorphous silicon region except the both end portions of the polysilicon region 5 in the longer direction, and the OFF-state current can be suppressed.

The elements having configurations common to those in Embodiment 1 are denoted by the same reference numerals, and detailed explanation thereof is omitted.

Embodiment 3

The present disclosure is not limited to Embodiments 1 and 2. In the television receiver 100 according to Embodiment 3, while the configuration of the thin film transistor for pixel (first channel region C1) differs from those of Embodiments 1 and 2, the first channel region C1 and the second channel region C2 are configured so that the electrical characteristics of the first and second channel regions C1, C2 differ from each other in the same manner as in Embodiments 1 and 2. The details will be described below.

Figure 9:
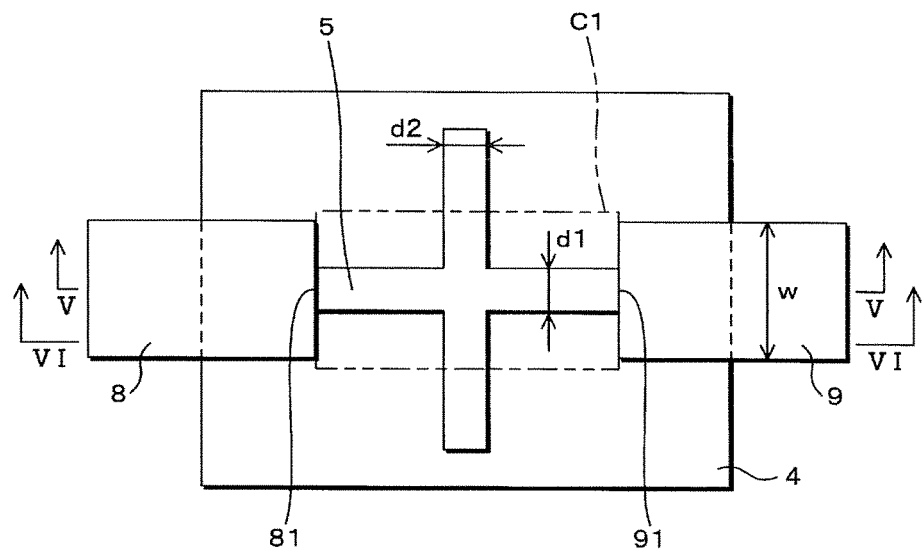
FIG. 9 shows a schematic plan view of one example of a thin film transistor for pixel of a television receiver according to Embodiment 3.
Figure 10:
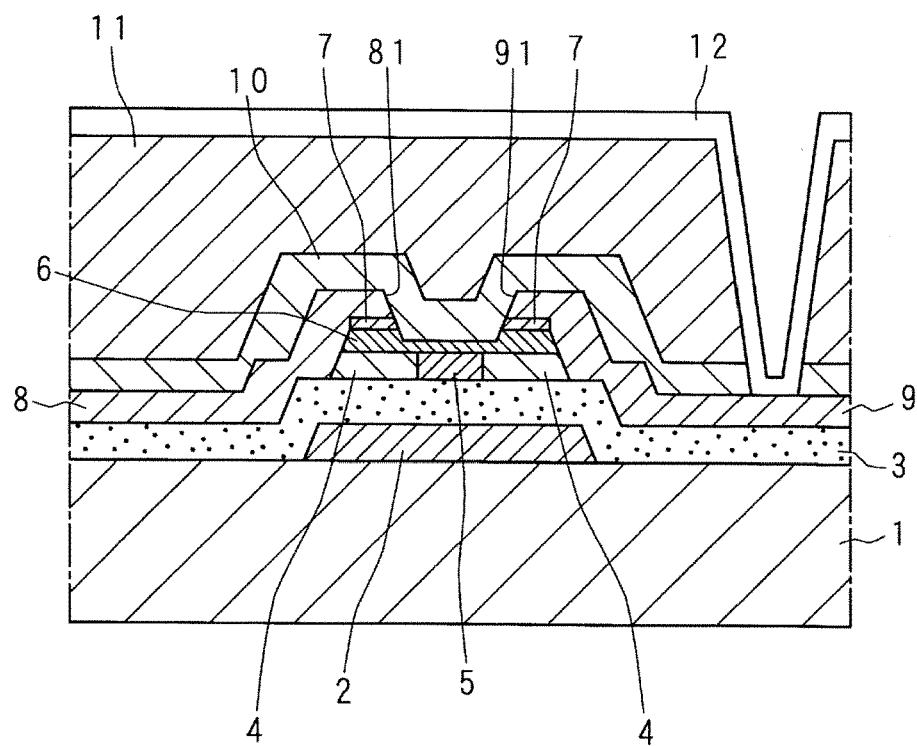
FIG. 10 shows a schematic cross-sectional view along a line VI-VI of FIG. 9.

FIG. 9 shows a schematic plan view (top view) of one example of a thin film transistor for pixel used for pixels of a television receiver 100 according to Embodiment 3, and FIG. 10 shows a schematic cross-sectional view along a line VI-VI of FIG. 9. The schematic cross-sectional view along a line V-V of FIG. 9 is the same as in FIG. 4 and is omitted. In addition, the thin film transistor for drive circuit according to Embodiment 3 is the same as in Embodiment 1, and the detail explanation thereof is omitted.

In the thin film transistor for pixel according to Embodiment 3, as shown in FIG. 9, the first channel region C1 is configured so as to include the amorphous silicon region and the polysilicon region. Namely, in the thin film transistor for pixel, both of the amorphous silicon region in the first amorphous silicon layer 4 and the polysilicon region 5 exist in the first channel region C1 which is a region between the source electrode 8 and the drain electrode 9.

As shown in FIG. 9 and FIG. 10, in the thin film transistor for pixel according to Embodiment 3, a long and narrow polysilicon region 5 is formed along the crosswise direction over a range from the end portion 81 of the source electrode 8 to the end portion 91 of the drain electrode 9. Namely, the polysilicon region included in the first channel region C1 has a longer direction thereof in an array direction (separating direction) of the source electrode 8 and the drain electrode 9. Further, the polysilicon region 5 is formed so that its dimension in the longitudinal direction gets large at an intermediate portion in the crosswise direction, in other words, at an intermediate portion between the end portions 81 of the source electrode 8 and the end portion 91 of the drain electrode 9 facing each other. In other words, a dimension of the polysilicon region in the longitudinal direction crossing at a right angle to the longer direction at an intermediate portion between the end of the drain electrode 9 and the end of the source electrode 8 is larger than a dimension of the polysilicon region in the longitudinal direction at a portion other than the intermediate portion. The portion other than the intermediate portion in other word is a portion between the intermediate portion and the drain electrode 9 or a portion between the intermediate portion and the source electrode 8.

Namely, in FIG. 9, the polysilicon region 5 is in a cruciform, and one of the both ends of the polysilicon region 5 in the crosswise direction overlaps with the end portion 81 of the source electrode 8 in a laminating direction of the first amorphous silicon layer 4 and the source electrode 8 and the drain electrode 9, and another end of the both ends of the polysilicon region 5 in the crosswise direction overlaps with the end portion 91 of the drain electrode 9 in the laminating direction of the first amorphous silicon layer 4 and the source electrode 8 and the drain electrode 9. In more detail, the both end portions of the polysilicon region 5 in the crosswise direction overlap with the end portion 81 of the source electrode 8 or the end portion 91 of the drain electrode 9, respectively at the intermediate portion of the source electrode 8 or the drain electrode 9 in the above-mentioned longitudinal direction.

In other words, a dimension "d1" of the polysilicon region 5 in the longitudinal direction is smaller than a dimension "W" of the source electrode 8 and the drain electrode 9 in the longitudinal direction, and the both ends of the polysilicon region 5 in the crosswise direction partially overlap with the end portion 81 of the source electrode 8 and the end portion 91 of the drain electrode 91 in the laminating direction. Further, in an extending portion of the polysilicon region 5 along the longitudinal direction, a dimension "d2" in the crosswise direction can be smaller than the dimension "W" of the source electrode 8 and the drain electrode 9 in the longitudinal direction.

In the television receiver 100 according to Embodiment 3, the thin film transistor for pixel (first channel region C1) has the configuration as mentioned above, and therefore, the thin film transistor for pixel can function suitably as the thin film transistor for pixel required to decrease an OFF-state current.

Namely, by making the dimension "d1" of the polysilicon region 5 in the longitudinal direction smaller than the dimension "W" of the source electrode 8 and the drain electrode 9 in the longitudinal direction, a region adjacent to or in the vicinity of the source electrode 8 or the drain electrode 9 in the first channel region C1 can be an amorphous silicon region except the both end portions of the polysilicon region 5 in the longer direction, and the OFF-state current can be suppressed.

Furthermore, since the region of the polysilicon region 5 is in a cruciform in FIG. 9, the dimension "d1" of the polysilicon region 5 in the longitudinal direction is enlarged at the intermediate portion of the polysilicon region 5 in the crosswise direction. Therefore, an ON-state current can be increased.

The elements having configurations common to those of Embodiment 1 are denoted by the same reference numerals and detailed explanation thereof is omitted.

Embodiment 4

The present disclosure is not limited to Embodiments 1 to 3. In the television receiver 100 according to Embodiment 4, while the configuration of the thin film transistor for pixel (first channel region C1) differs from those of Embodiments 1 to 3, the first channel region C1 and the second channel region C2 are configured so that the electrical characteristics of the first and second channel regions C1, C2 differ from each other in the same manner as in Embodiments 1 to 3. The details will be described below.

Figure 11:
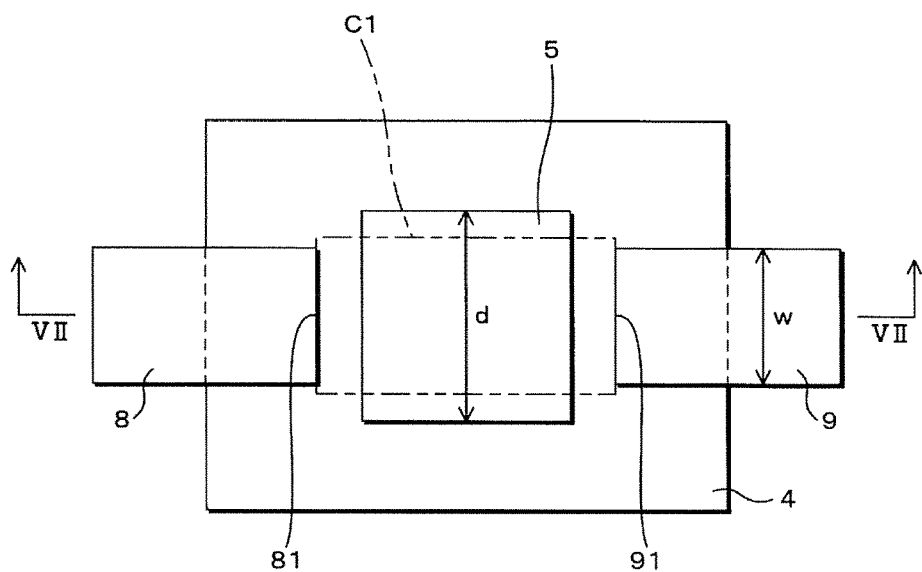
FIG. 11 shows a schematic plan view of one example of a thin film transistor for pixel of a television receiver according to Embodiment 4.
Figure 12:
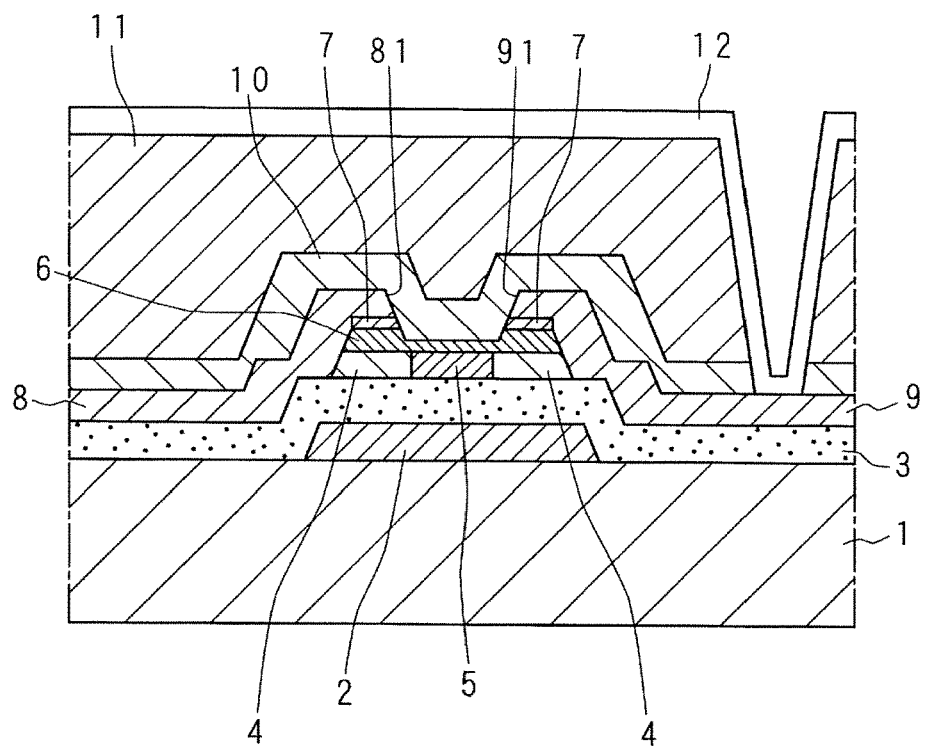
FIG. 12 shows a schematic cross-sectional view along a line VII-VII of FIG. 11.

FIG. 11 shows a schematic plan view (top view) of one example of a thin film transistor for pixel used for pixels of a television receiver 100 according to Embodiment 4. FIG. 12 shows a schematic cross-sectional view along a line VII-VII of FIG. 11. The configuration of the thin film transistor for drive circuit of Embodiment 4 is the same as in Embodiment 1, and the detailed description thereof is omitted.

In the thin film transistor for pixel according to Embodiment 4, as shown in FIG. 11, the first channel region C1 is configured so as to include an amorphous silicon region and a polysilicon region. Namely, in the thin film transistor for pixel, both of the amorphous silicon region in the first amorphous silicon layer 4 and the polysilicon region 5 exist in the first channel region C1 which is a region between the source electrode 8 and the drain electrode 9.

As shown in FIG. 11 and FIG. 12, in the thin film transistor for pixel (first thin film transistor) according to Embodiment 4, the polysilicon region 5 included in the first channel region C1 is formed at one place between the end portion 81 of the source electrode 8 facing the drain electrode 9 and the end portion 91 of the drain electrode 9 facing the source electrode 8.

Namely, the polysilicon region 5 has a rectangular shape, and intervenes between the end portion 81 of the source electrode 8 and the end portion 91 of the drain electrode 9. The polysilicon region 5 is formed separated from the end portion 81 of the source electrode 8 and the end portion 91 of the drain electrode 9.

A dimension "d" of the polysilicon region 5 in the longitudinal direction is larger than a dimension "W" of the source electrode 8 and the drain electrode 9 in a longitudinal direction. However, the polysilicon region included in the first channel region does not overlap with either of the end portion 81 of the source electrode 8 or the end portion 91 of the drain electrode 9 in the laminating direction of the first amorphous silicon layer 4 with the source electrode 8 and the drain electrode 9.

In the television receiver 100 according to Embodiment 4, the thin film transistor for pixel (first channel region C1) has the configuration as mentioned above, and therefore, the thin film transistor for pixel can function suitably as the thin film transistor for pixel required to decrease an OFF-state current.

As mentioned above, in the thin film transistor for pixel according to Embodiment 4, the polysilicon region 5 is formed between the end portion 81 of the source electrode 8 and the end portion 91 of the drain electrode 9 with the amorphous silicon region of the first amorphous silicon layer 4 being interposed between the polysilicon region 5 and the source electrode 8 and between the polysilicon region 5 and the drain electrode 9. Namely, the amorphous silicon regions of the first amorphous silicon layer 4 having a large electric resistance are formed between the polysilicon region 5 and the end portion 81 of the source electrode 8 and between the polysilicon region 5 and the end portion 91 of the drain electrode 9. Therefore, a region adjacent to or in the vicinity of the source electrode 8 or the drain electrode 9 in the first channel region C1 can be an amorphous silicon region, and an OFF-state current can be suppressed.

The elements having configurations common to those of Embodiment 1 are denoted by the same reference numerals and detailed explanation thereof is omitted.

Embodiment 5

The present disclosure is not limited to Embodiments 1 to 4. In the television receiver 100 according to Embodiment 5, while the configuration of the thin film transistor for pixel (first channel region C1) differs from those of Embodiments 1 to 4, the first channel region C1 and the second channel region C2 are configured so that the electrical characteristics of the first and second channel regions C1, C2 differ from each other in the same manner as in Embodiments 1 to 4. The details will be described below.

Figure 13:
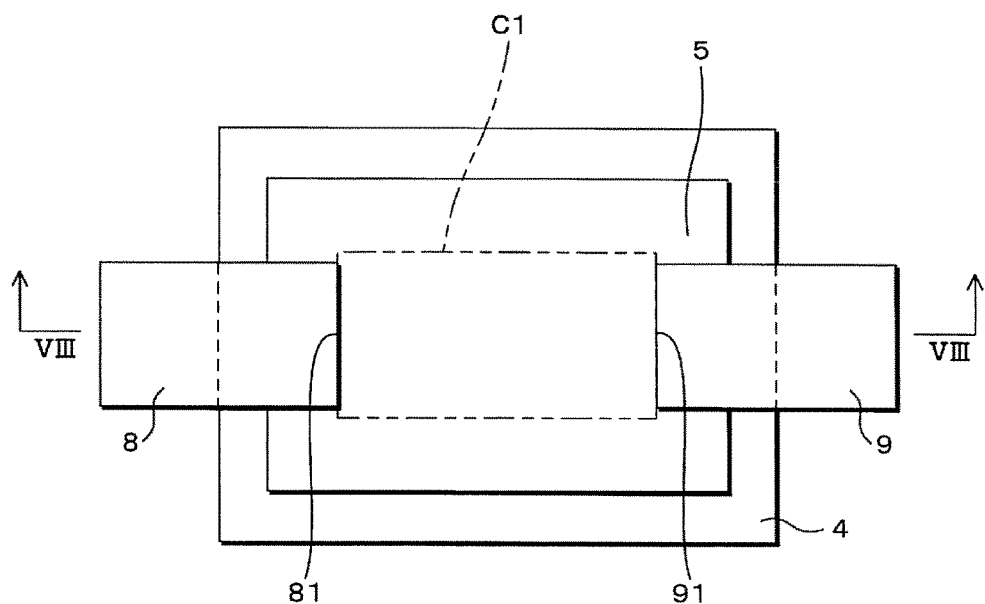
FIG. 13 shows a schematic plan view of one example of a thin film transistor for pixel of a television receiver according to Embodiment 5.

FIG. 13 shows a schematic plan view (top view) of one example of a thin film transistor for pixel used for pixels of a television receiver 100 according to Embodiment 5. A schematic cross-sectional view along a line VIII-VIII of FIG. 13 is the same as in FIG. 4, and is not shown. Further, the configuration of the thin film transistor for drive circuit for Embodiment 5 is the same as in Embodiment 1 (FIG. 2B), and the detailed description thereof is omitted.

In the thin film transistor for pixel according to Embodiment 5, as shown in FIG. 13 and FIG. 2B, only the polysilicon region is formed in the first channel region C1 (and the second channel region C2 of the thin film transistor for drive circuit), namely in a region between the end portion 81 of the source electrode 8 and the end portion 91 of the drain electrode 9.

Namely, in Embodiment 5, the first channel region C1 in the thin film transistor for pixel and the second channel region C2 of the thin film transistor for drive circuit have the same structure. However, the first channel region C1 and the second channel region C2 are configured to differ from each other in degree of crystallinity of polysilicon in the polysilicon region 5. Namely, crystallinity of polysilicon in the polysilicon region included in the first channel region C1 is different from crystallinity of polysilicon in the polysilicon region included in the second channel region C2.

In particular, in the step S16 of FIG. 5, for example, by using a half-tone mask or by changing a power density of energy beams (laser) or the number of irradiations, the polysilicon region 5 having lower crystallinity is formed in the first channel region C1, and the polysilicon region 5 having higher crystallinity (at least higher than that of the first channel region C1) is formed in the second channel region C2. The half-tone mask has a laser beam transmission part, a laser beam shielding part and, for example, a semi-transmission part having a light transmittance being different from light transmittance of the laser beam transmission part and being different from light transmittance of the laser beam shielding part.

Thus, in Embodiment 5, mobility of electrons (or holes) in the first channel region C1 of the thin film transistor for pixel and in the second channel region C2 of the thin film transistor for drive circuit can be suitably controlled.

Figure 14:
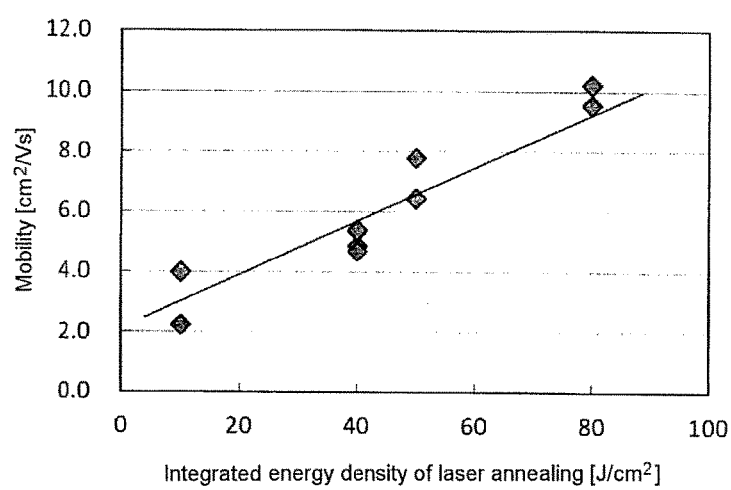
FIG. 14 shows a graph of a relation between an integrated energy density of laser annealing and mobility.

FIG. 14 shows a graph for explanation of a relation between an integrated energy density of laser annealing and mobility. Generally when the integrated energy density of laser annealing is high, namely when the integrated energy density of laser annealing is increased at the time of laser annealing for amorphous silicon, crystallinity of polycrystal silicon becomes high. Here, the integrated energy density of laser annealing is a value obtained by multiplying a laser power density by the number of irradiations.

As shown in FIG. 14, it can be appreciated that as the integrated energy density of laser annealing is higher, in other word, as crystallinity of polysilicon by laser annealing is higher, mobility of electrons (holes) is high.

As mentioned above, in the television receiver 100 according to Embodiment 5, the channel regions are configured so that electron mobility (electrical characteristic) of the first channel region C1 and electron mobility of the second channel region C2 differ from each other, thereby enabling the thin film transistor for pixel to function as a transistor suitable for pixels to display images and enabling the thin film transistor for drive circuit to function as a transistor suitable for drive circuit for the pixels.

Namely, for the pixels required to decrease an OFF-state current, the OFF-state current can be surely decreased by lowering crystallinity of the polysilicon region 5 of the first channel region C1. Further, for the drive circuit (a peripheral circuit) required to increase an ON-state current, the ON-state current can be surely increased by heightening crystallinity of the polysilicon region 5 of the second channel region C2.

The elements having configurations common to Embodiment 1 are denoted by the same reference numerals and detailed explanation thereof is omitted.

Figure 15:
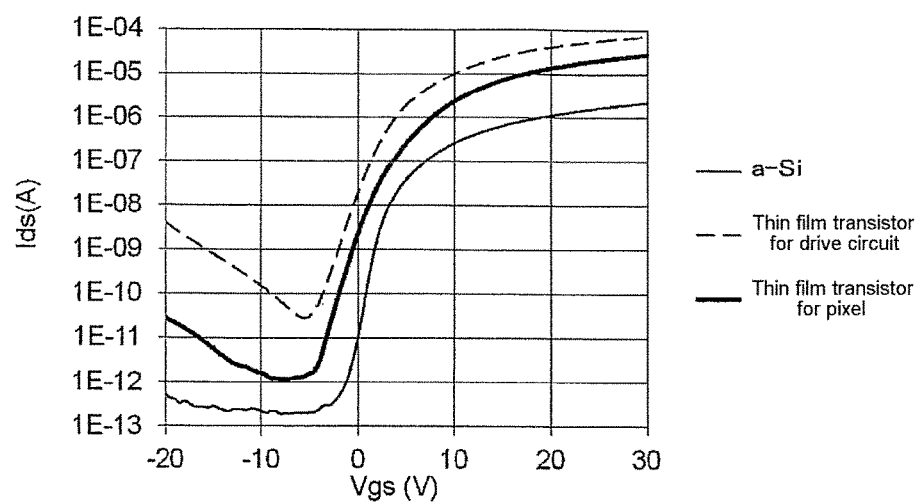
FIG. 15 shows a graph showing a change of an electric current between ON-state and OFF-state in the case where electrical characteristic of the first channel region is different from electrical characteristic of the second channel region.

FIG. 15 shows a graph showing a change of an electric current between ON-state and OFF-state in the case where electrical characteristic of the first channel region C1 is different from electrical characteristic of the second channel region C2 as mentioned above. Namely, FIG. 15 shows so-called a characteristic curve of a TFT. In FIG. 15, a continuous line shows a characteristic of a thin film transistor consisting of amorphous silicon (a-Si), a bold line shows a characteristic of a thin film transistor for pixel in Embodiment 5, and a broken line shows a characteristic of a thin film transistor for drive circuit in Embodiment 5.

As shown in FIG. 15, in the thin film transistor for drive circuit, both electric currents at ON-state and at OFF-state are high. On the other hand, in the thin film transistor for pixel, electric currents at ON-state and at OFF-state, especially at OFF-state are greatly lowered as compared with electric currents of the thin film transistor for drive circuit. Further, it can be appreciated that electric current at ON-state in the thin film transistor for pixel is higher than that of the thin film transistor consisting of amorphous silicon.

In the description mentioned above, an example is described, in which the first channel region C1 and the second channel region C2 are formed so as to have different electrical characteristic from each other by crystallizing the a-Si film 4 with a partial irradiation type laser in the thin film transistor for pixel or the thin film transistor for drive circuit, but the present disclosure is not limited thereto.

Namely, each channel region may be formed by irradiating energy beams (for example, laser) onto a whole surface of the substrate thereby turning the first amorphous silicon layer formed on the whole surface of the substrate to a polysilicon region and then conducting steps of exposing, developing and etching treatments on the polysilicon region.

What is claimed is:

1. A display apparatus comprising:
a pixel having a first thin film transistor, and a drive circuit having a second thin film transistor and driving the pixel, wherein each of the first thin film transistor and the second thin film transistor comprises a gate electrode, a gate insulating film covering the gate electrode, a first amorphous silicon layer formed on the gate insulating film and including a polysilicon region and an amorphous silicon region, a second amorphous silicon layer covering the first amorphous silicon layer, and a source electrode and a drain electrode formed apart from each other above the second amorphous silicon layer;

wherein the first thin film transistor has a first channel region including a first part of the first amorphous silicon layer, the first part being a part between the source electrode and the drain electrode of the first thin film transistor in a top view;

wherein the second thin film transistor has a second channel region including a second part of the first amorphous silicon layer, the second part being a part between the source electrode and the drain electrode of the second thin film transistor in a top view;

wherein the first channel region includes the amorphous silicon region and the polysilicon region in the first part;

wherein the second channel region includes the polysilicon region in the second part, the second channel region does not include the amorphous silicon region in the second part; and wherein electrical characteristic of the first channel region is different from electrical characteristic of the second channel region.

2. The display apparatus of claim 1, wherein the polysilicon region included in the first channel region comprises a first region and a second region being separated from each other;

the first region overlaps with the source electrode of the first thin film transistor in a laminating direction of the first amorphous silicon layer with the source electrode and the drain electrode; and the second region overlaps with the drain electrode of the first thin film transistor in the laminating direction.

3. The display apparatus of claim 1, wherein the polysilicon region included in the first channel region has a longer direction in an array direction of the source electrode and the drain electrode of the first thin film transistor;

a first end of the polysilicon region in the longer direction overlaps with an end of the source electrode in a laminating direction of the first amorphous silicon layer with the source electrode and the drain electrode, the end of the source electrode facing the drain electrode; and a second end of the polysilicon region opposed to the first end overlaps with an end of the drain electrode in the laminating direction, the end of the drain electrode facing the source electrode.

4. The display apparatus of claim 3, wherein in the first channel region, a dimension of the polysilicon region in a longitudinal direction crossing at a right angle to the longer direction at an intermediate portion between the end of the drain electrode and the end of the source electrode is larger than a dimension of the polysilicon region in the longitudinal direction at a portion between the intermediate portion and the drain electrode or the source electrode.

5. The display apparatus of claim 1, wherein the polysilicon region included in the first channel region is formed at one place and intervenes between an end of the source electrode facing the drain electrode and an end of the drain electrode facing the source electrode; and the polysilicon region included in the first channel region does not overlap with either of the source electrode or the drain electrode in a laminating direction of the first amorphous silicon layer with the source electrode and the drain electrode.

6. The display apparatus of claim 1, wherein crystallinity of polysilicon in the polysilicon region included in the first channel region is different from crystallinity of polysilicon in the polysilicon region included in the second channel region.

* * * * *